(12) United States Patent
Suzuki

(10) Patent No.: US 9,653,833 B2
(45) Date of Patent: May 16, 2017

(54) CONTACT PIN AND ELECTRICAL COMPONENT SOCKET

(71) Applicant: ENPLAS CORPORATION, Kawaguchi (JP)

(72) Inventor: Satoru Suzuki, Kawaguchi (JP)

(73) Assignee: ENPLAS CORPORATION, Kawaguchi (JP)

( * ) Notice: Subject to any disclaimer, the term of this patent is extended or adjusted under 35 U.S.C. 154(b) by 0 days.

(21) Appl. No.: 15/022,147

(22) PCT Filed: Sep. 9, 2014

(86) PCT No.: PCT/JP2014/073787
§ 371 (c)(1),
(2) Date: Mar. 15, 2016

(87) PCT Pub. No.: WO2015/041099
PCT Pub. Date: Mar. 26, 2015

(65) Prior Publication Data
US 2016/0240952 A1  Aug. 18, 2016

(30) Foreign Application Priority Data

Sep. 17, 2013 (JP) ................................. 2013-191327

(51) Int. Cl.
*H01R 11/22* (2006.01)
*H01R 13/24* (2006.01)
(Continued)

(52) U.S. Cl.
CPC ......... *H01R 13/2485* (2013.01); *G01R 1/073* (2013.01); *H01R 12/714* (2013.01); *H05K 7/1069* (2013.01)

(58) Field of Classification Search
CPC ...... H01R 12/88; H01R 12/89; H01R 13/193; H01R 13/62905; H01R 13/2485; H05K 1/0271; H05K 1/0313
(Continued)

(56) References Cited

U.S. PATENT DOCUMENTS 6,042,409 A * 3/2000 Ohshima .............. H01R 13/193
                                                    439/268
6,471,531 B2 * 10/2002 Kanesashi ................ H01R 4/48
                                                    439/263
(Continued)

FOREIGN PATENT DOCUMENTS

JP       8-148247      6/1996
JP     2002-359025    12/2002
(Continued)

OTHER PUBLICATIONS

International Search Report mailed Oct. 28, 2014, in corresponding International Application No. PCT/JP2014/073787.

*Primary Examiner* — Hae Moon Hyeon
(74) *Attorney, Agent, or Firm* — Staas & Halsey LLP

(57) ABSTRACT

Providing an electrical component socket that enables stability of an electric resistance value to be maintained even after repeated use. A contact pin of the present invention includes: a lower contact portion; a spring portion that is provided so as to extend upward from the lower contact portion; a linear portion provided so as to extend upward from an upper end of the spring portion; and an upper contact portion that is formed on an upper end side of the linear portion. The upper contact portion includes a first contact protrusion arranged on an extension of the linear portion and a plurality of second contact protrusions arranged at respective positions off the extension of the linear portion.

6 Claims, 11 Drawing Sheets

(51) Int. Cl.
*G01R 1/073* (2006.01)
*H01R 12/71* (2011.01)
*H05K 7/10* (2006.01)

(58) Field of Classification Search
USPC ............... 439/331, 330, 264, 266, 268, 525
See application file for complete search history.

(56) References Cited

U.S. PATENT DOCUMENTS

| | | | | |
|---|---|---|---|---|
| 6,749,443 | B2* | 6/2004 | Sano | H01R 13/2485 |
| | | | | 439/331 |
| 7,462,056 | B2* | 12/2008 | Yeh | H01R 12/58 |
| | | | | 439/331 |
| 8,092,231 | B2* | 1/2012 | Suzuki | G01R 1/0466 |
| | | | | 439/70 |
| 8,342,872 | B2* | 1/2013 | Suzuki | G01R 1/0466 |
| | | | | 439/331 |
| 2002/0182915 | A1 | 12/2002 | Watanabe | |
| 2011/0212641 | A1 | 9/2011 | Suzuki | |
| 2012/0058683 | A1 | 3/2012 | Suzuki et al. | |

FOREIGN PATENT DOCUMENTS

| | | |
|---|---|---|
| JP | 2005-63868 | 3/2005 |
| JP | 2005-166358 | 6/2005 |
| JP | 2005-228716 | 8/2005 |
| JP | 2011-71029 | 4/2011 |
| JP | 2012-54207 | 3/2012 |

\* cited by examiner

NON-PRESSED STATE

PRESSED STATE

CONTACT PIN AND ELECTRICAL COMPONENT SOCKET

CROSS-REFERENCE TO RELATED APPLICATIONS

This application is a U.S. National Stage Application, which claims the benefit under 35 U.S.C. §371 of PCT International Patent Application No. PCT/JP2014/073787, filed Sep. 9, 2014, which claims the foreign priority benefit under 35 U.S.C. §119 of Japanese Patent Application No. 2013-191327, filed Sep. 17, 2013, the contents of which are incorporated herein by reference.

TECHNICAL FIELD

This invention relates to a contact pin that electrically connects a first electrical component and a second electrical component, and an electrical component socket including the contact pin, the electrical component socket being disposed on a wiring substrate and receiving an electrical component such as a semiconductor device (hereinafter referred to as "IC package") in order to conduct, e.g., a test of the electrical component.

BACKGROUND ART

Conventional examples of this type of electrical component socket include an Integrated Circuit (IC) socket, such as described in Japanese Patent Laid-Open No. 2011-71029, for conducting a performance test such as a burn-in test of an IC package.

The IC socket includes a plurality of contact pins, and the contact pins are brought into contact with spherical terminals of an electrical component such as an IC package. Each of the contact pins includes a curved spring portion in an intermediate portion thereof, and at an upper end of each contact pin, an upper contact portion is provided. Also, at an upper edge portion of the upper contact portion, a pair of contact protrusions is provided in such a manner that the contact protrusions transversely face each other.

In a test of the electrical component, the terminals of the electrical component are pressed against the upper contact portions of the contact pins from above. Consequently, the curved spring portion of each contact pin is compressed, generating an elastic force. The elastic force brings the pair of contact protrusions of the upper contact portion into pressure contact with the corresponding terminal of the electrical component. As described above, the upper contact portions and the terminals of the electrical component are brought into pressure contact with each other via a plurality of contact points, enabling enhancement in electric conductivity of the IC socket.

SUMMARY OF INVENTION

However, the electrical component socket in Patent Literature 1 has a problem that with contact pin pitch reduction, plate-like contact pins are made to be thinner and thus cannot provide a large spring force, resulting in decrease in contact pressure between the terminals of the electrical component and the upper contact portions of the contact pins. Therefore, with repeated use of the electrical component socket, the electric resistance value may become unstable (that is, variation in electric resistance value in, e.g., performance tests may become very large). If the electric resistance value varies greatly each time, e.g., a performance test is conducted, the reliability of the performance tests is undermined.

The present invention has been made in order to solve the aforementioned problem, and an object of the present invention is to provide an electrical component socket that enables stability of an electric resistance value to be maintained even after repeated use.

In order to achieve the above object, a contact pin according to the present invention is a contact pin to electrically connect a first electrical component and a second electrical component, the contact pin including: a lower contact portion to be electrically connected to a contact point of the first electrical component; a spring portion that is provided so as to extend above the lower contact portion, and in a pressed state, elastically deforms; a linear portion provided so as to extend upward from an upper end of the spring portion; and an upper contact portion that is formed on an upper end side of the linear portion, and in the pressed state, is brought into pressure contact with a terminal of the second electrical component by an elastic force of the spring portion, wherein the upper contact portion includes a first contact protrusion arranged on an extension of the linear portion, in the pressed state, a distal end portion of the first contact protrusion being brought into pressure contact with the terminal of the second electrical component, and a plurality of second contact protrusions arranged at respective positions off the extension of the linear portion, in the pressed state, a distal end portion of each of the plurality of second contact protrusions being brought into pressure contact with the terminal of the second electrical component.

In the contact pin according to the present invention, it is desirable that at the upper contact portion, one said first contact protrusion and a plurality of the second contact protrusions be arranged in a substantially circular pattern.

In the contact pin according to the present invention, it is desirable that the spring portion have a curved shape, and the second contact protrusions be arranged so as to be offset in a direction opposite to a direction of bulging of a curve of the spring portion with reference to the extension of the linear portion.

In the contact pin according to the present invention, it is desirable that the first contact protrusion be formed in such a manner that the distal end portion thereof is dug into the terminal of the second electrical component.

An electrical component socket according to the present invention includes: a socket body that is installed on the first electrical component, and includes a receiving portion to receive the second electrical component; and a plurality of contact pins disposed in the socket body, in a state in which the second electrical component is pressed, the plurality of contact pins electrically connecting the second electrical component to the first electrical component, and each of the contact pins includes a lower contact portion to be electrically connected to a contact point of the first electrical component, a spring portion that is provided so as to extend above the lower contact portion, and in the pressed state, elastically deforms, a linear portion provided so as to extend upward from an upper end of the spring portion, and an upper contact portion that is formed on an upper end side of the linear portion, and in the pressed state, is brought into pressure contact with a terminal of the second electrical component by an elastic force of the spring portion, and the upper contact portion includes a first contact protrusion arranged on an extension of the linear portion, in the pressed state, a distal end portion of the first contact protrusion being brought into pressure contact with the terminal of the second electrical component, and a plurality of second contact protrusions arranged at respective positions off the extension of the linear portion, in the pressed state, a distal end portion of each of the plurality of second contact protrusions being brought into pressure contact with the terminal of the second electrical component.

In the contact pin according to the present invention, the first contact protrusion is formed on the extension of the linear portion, and in a pressed state, the distal end portion of the first contact protrusion is brought into pressure contact with the terminal of the second electrical component, and thus a force of the pressure contact can effectively be transmitted to the spring portion via the linear portion, which can make the pressure of contact between the terminal of the electrical component and the upper contact portion of the contact pin sufficiently high.

In addition, in the contact pin according to the present invention, the plurality of second contact protrusions can be brought into abutment with the terminal of the second electrical component and thereby support the terminal, enabling contact stability enhancement.

In the contact pin according to the present invention, the first contact protrusion and the second contact protrusions are arranged in a substantially circular pattern at the upper contact portion, and thus, even if the terminal of the second electrical component has a substantially spherical shape, the stability of the contact can be made to be sufficiently high.

In the contact pin according to the present invention, the second contact protrusions are arranged so as to be offset in a direction opposite to a direction of bulging of a curve of the spring portion, and thus even if a direction of an elastic force of the spring portion is inclined in the direction of bulging of the curve, the stability of the contact can be made to be sufficiently high.

In the contact pin according to the present invention, the distal end portion of the first contact protrusion is dug into the terminal of the second electrical component, enabling further enhancement in pressure of contact between the terminal of the electrical component and the upper contact portion of the contact pin.

In the electrical component socket according to the present invention, the first contact protrusion is arranged on the extension of the linear portion, and in a pressed state, the distal end portion of the first contact protrusion is brought into pressure contact with the terminal of the electrical component, and thus, the pressure of contact between the terminal of the electrical component and the upper contact portion of the contact pin can be made to be sufficiently high.

In addition, in the electrical component socket according to the present invention, the plurality of second contact protrusions can be brought into abutment with the terminal of the second electrical component and thereby support the terminal, enabling contact stability enhancement.

BRIEF DESCRIPTION OF DRAWINGS

FIG. 1A illustrates a state in which opening/closing bodies are opened; and FIG. 1B illustrates a state in which the opening/closing bodies are closed.

FIG. 10A illustrates a non-pressed state; and FIG. 10B illustrates a pressed state.

FIG. 11A is a side view; and FIG. 11B is a bottom view.

DESCRIPTION OF EMBODIMENTS

Figure 1A:
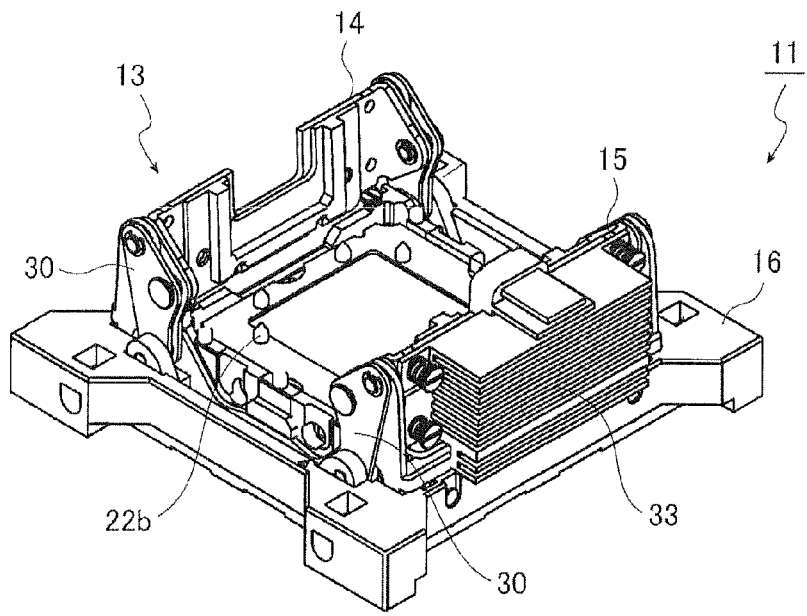
FIGS. 1A and 1B include perspective views illustrating an IC socket according to Embodiment 1 of this invention.
Figure 1B:
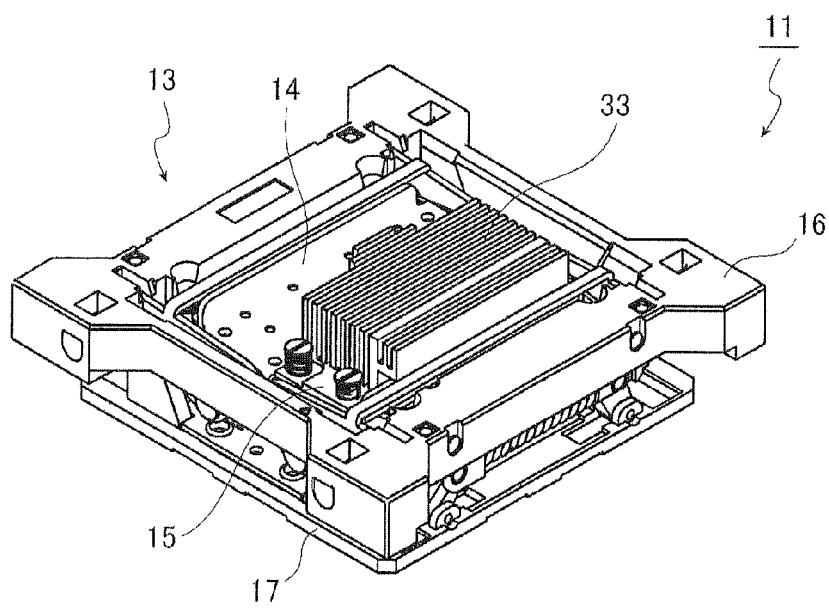

An embodiment of this invention will be described below.

FIGS. 1 to 11 illustrate an embodiment of this invention.

First, a configuration will be described. In the figures, reference numeral 11 denotes an IC socket, which is an "electrical component socket", and the IC socket 11 is intended to, in order to conduct a performance test of an IC package 12 (see FIGS. 11A and 11B), which is a "second electrical component", electrically connect solder balls 12b, which are "terminals" of the IC package 12, and a wiring substrate 10 (see FIG. 3) of a measurement instrument (tester), which is a "first electrical component".

Figure 11A:
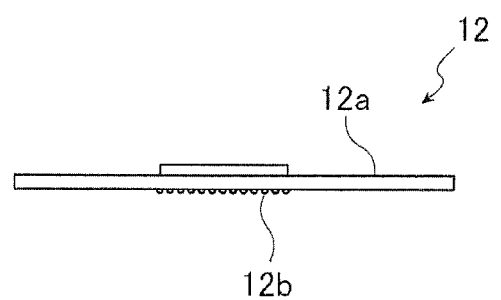
FIGS. 11A and 11B include diagrams of an IC package.
Figure 11B:
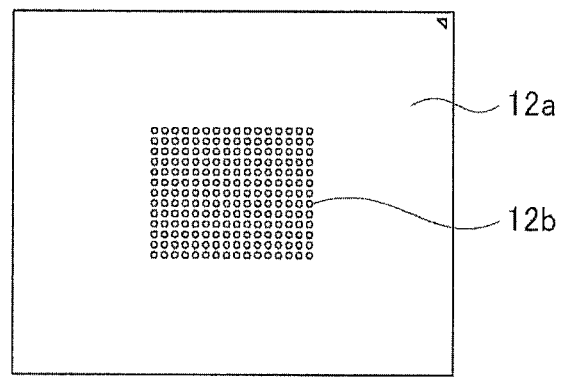

As illustrated in FIGS. 11A and 11B, the IC package 12 here is of a BGA (ball grid array) type in which a multitude of solder balls 12b, which are "terminals", are arrayed in a matrix on a bottom surface of a substantially square-shaped package body 12a. Also, the IC package 12 may be an IC package of an LGA (land grid array) type in which flat electrode pads are arranged in a grid instead of the solder balls.

As illustrated in FIGS. 1 to 5, the IC socket 11 includes a synthetic resin socket body 13 to be attached onto the wiring substrate 10. In the socket body 13, a pair of opening/closing bodies 14 and 15 that press the IC package 12 is disposed and a quadrangular frame-shaped operation member 16 for opening/closing the opening/closing bodies 14 and 15 is provided.

In the socket body 13, a contact pin unit 19 is disposed inside an outer frame 18 having a quadrangular frame shape.

Figure 3:
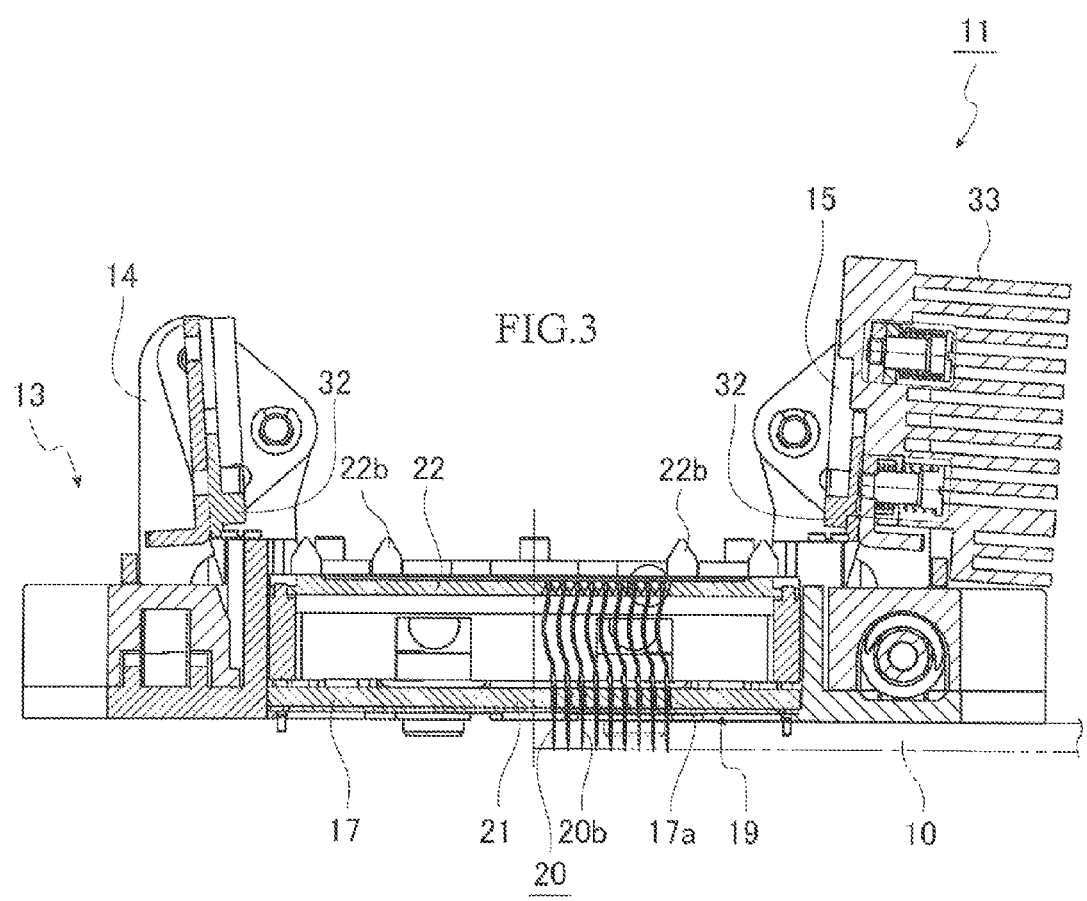
FIG. 3 is a cross-sectional view of the IC socket along line A-A in FIG. 2 according to Embodiment 1.
Figure 4:
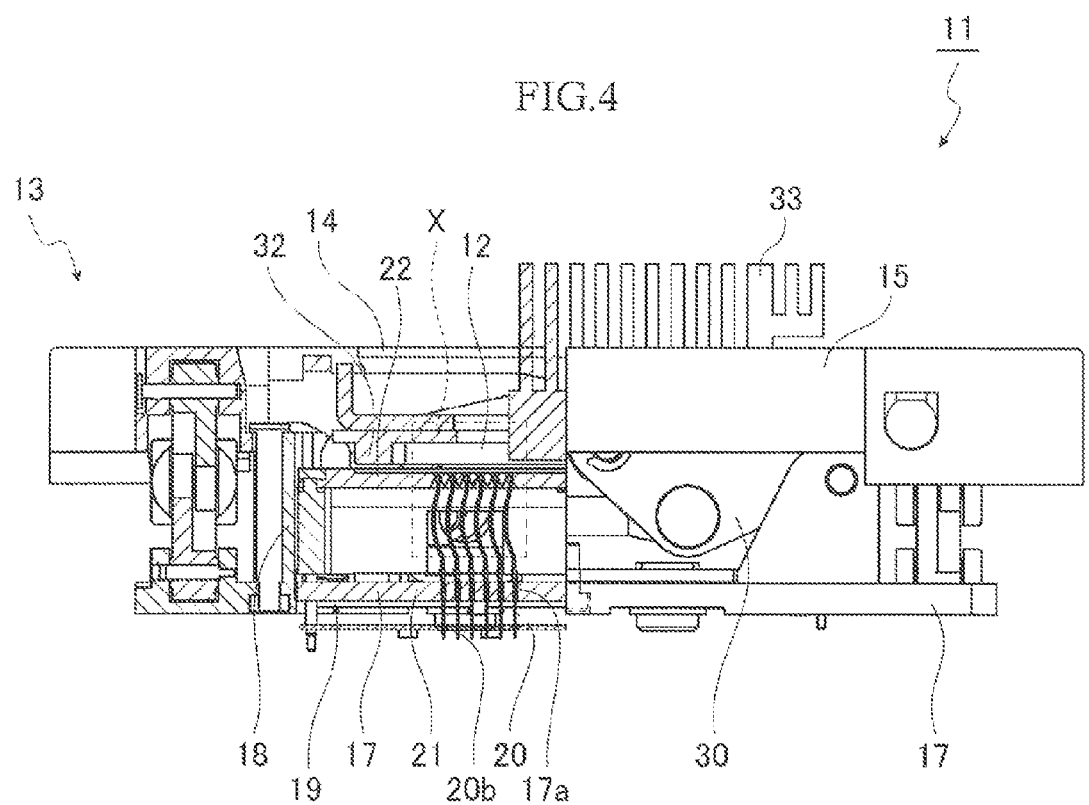
FIG. 4 is a cross-sectional view of the IC socket along line B-B in FIG. 2 according to Embodiment 1.
Figure 5:
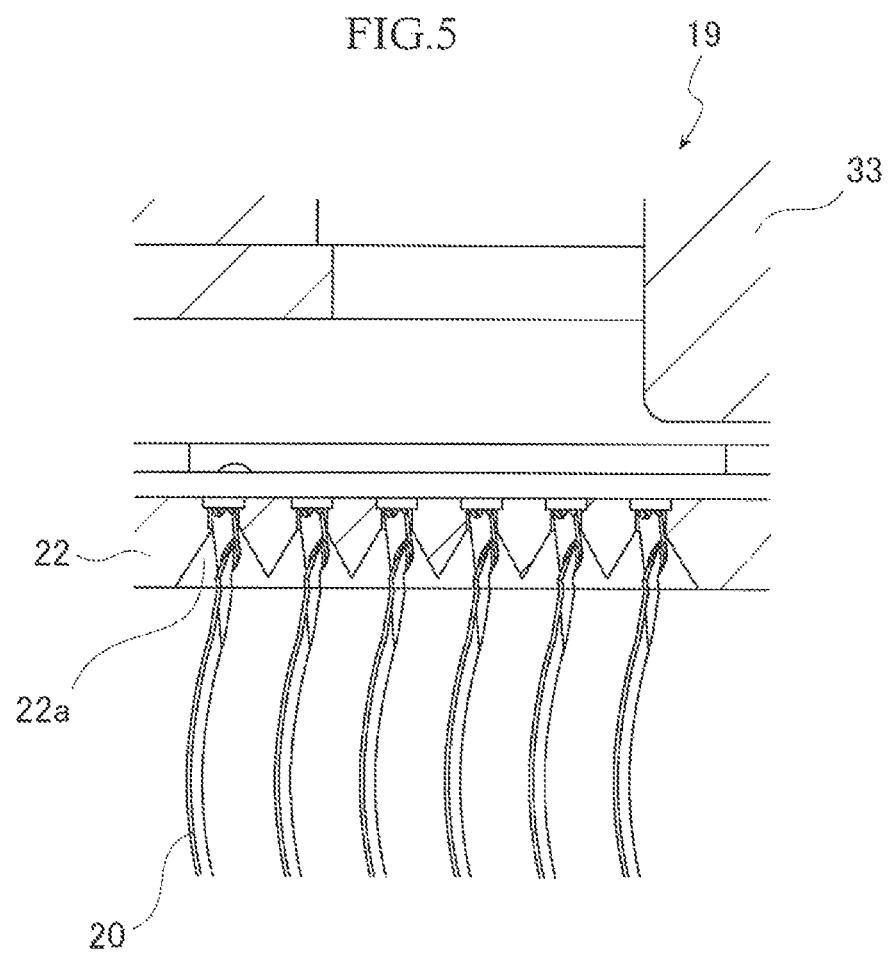
FIG. 5 is an enlarged view of part X in FIG. 4 according to Embodiment 1.

As illustrated in FIGS. 3 to 5, the contact pin unit 19 includes a unit body 21 in which a plurality of contact pins 20 are disposed, a floating plate 22 disposed on the upper side of the unit body 21 so as to be vertically movable, the floating plate 22 receiving the IC package 12, and coil springs (not illustrated) that bias the floating plate 22 upward.

Figure 2:
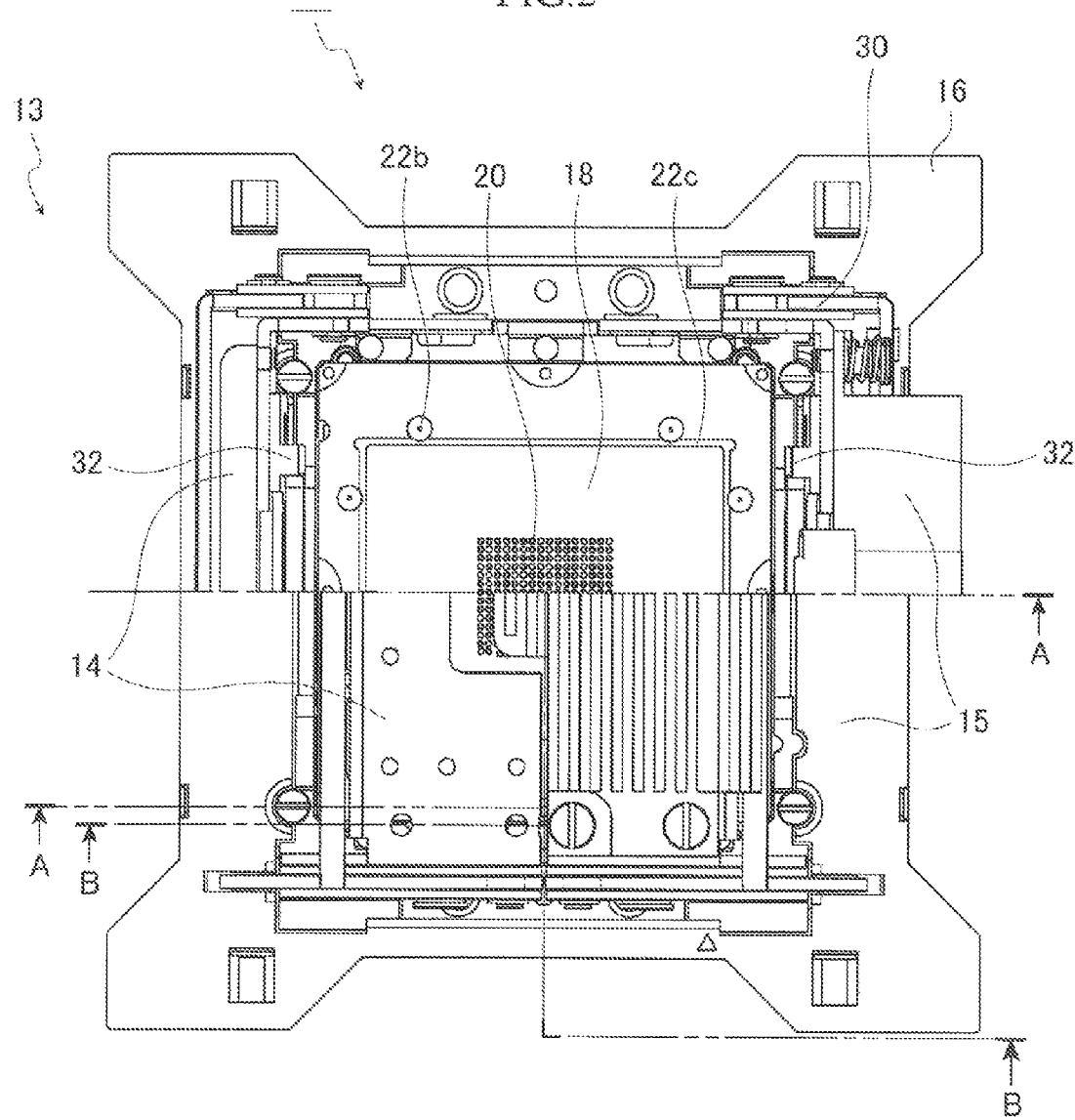
FIG. 2 is a plan view illustrating the IC socket according to Embodiment 1.

In the floating plate 22, as illustrated in FIG. 5, a multitude of conical through-holes 22a in which the contact pins 20 are inserted are formed, and as illustrated in FIGS. 1 to 3, guide portions 22b that guide respective corner portions of the IC package 12 are formed. Furthermore, as illustrated in FIG. 2, the floating plate 22 includes a receiving portion 22c that receives peripheral edge portions of the IC package 12.

As illustrated in FIG. 2 etc., the opening/closing bodies 14 and 15 each include a pressing member 32 provided to the socket body 13 via a linking mechanism 30 so as to be openable/closeable. Also, on an upper surface of the opening/closing body 15, a heatsink 33 is provided. When the operation member 16 is located at a lowermost position, the opening/closing bodies 14 and 15 and the heatsink 33 are opened (see FIG. 1A), and upon the operation member 16 being raised from this state and positioned at an uppermost position, the linking mechanisms 30 are actuated and the opening/closing bodies 14 and 15 and the heatsink 33 are thereby closed (see FIG. 1B).

Figure 6:
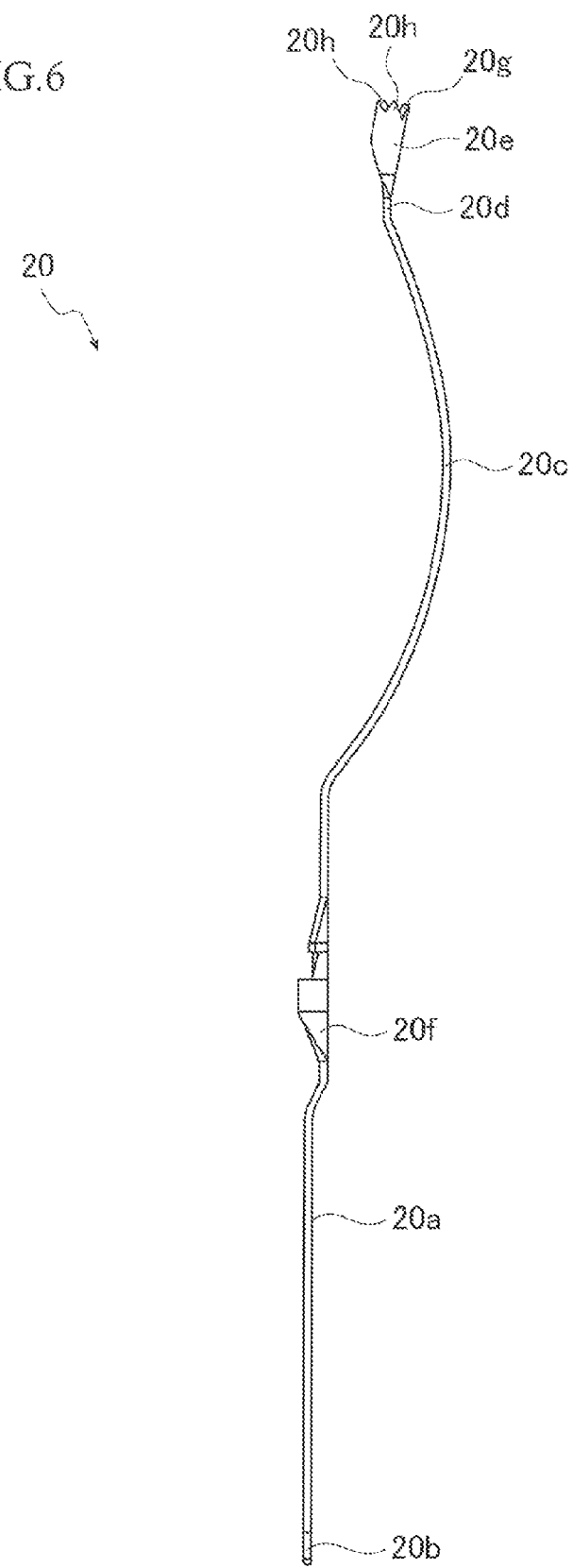
FIG. 6 is a side view of a single contact pin according to Embodiment 1.
Figure 7:
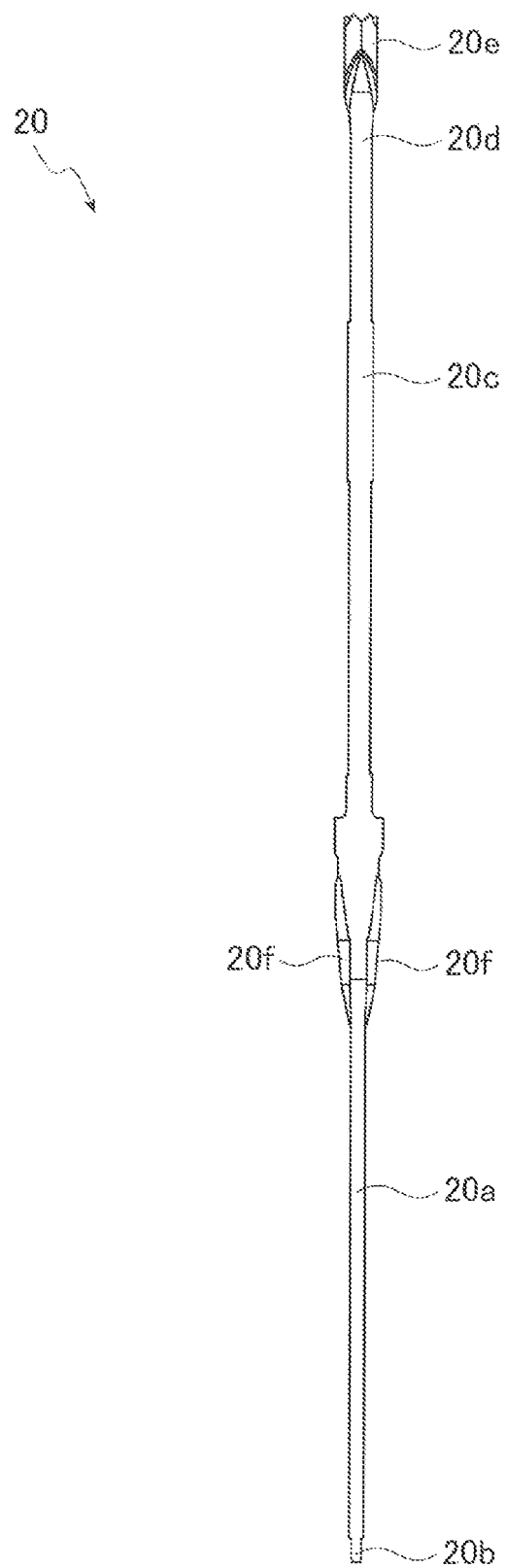
FIG. 7 is a front view of a single contact pin according to Embodiment 1.
Figure 8:
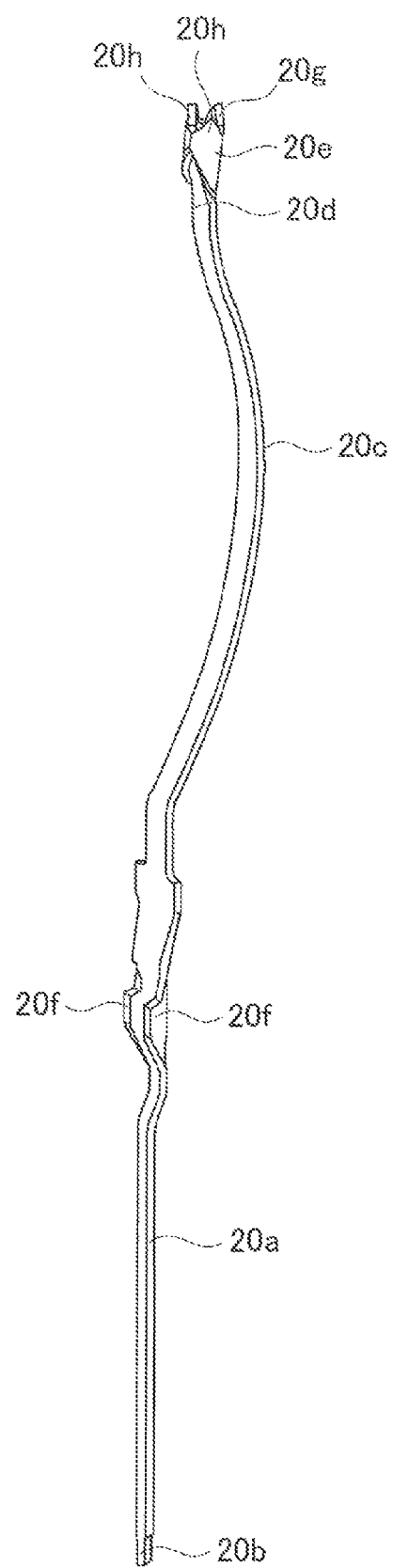
FIG. 8 is a perspective view of a single contact pin according to Embodiment 1.

The contact pins 20 are formed by a highly electrically conductive metal plate (for example, beryllium copper) being subjected to press working, and disposed at a narrow pitch in such a manner that the contact pins 20 are inserted through the base member 17 and the floating plate 22 so as to straddle the base member 17 and the floating plate 22. As illustrated in FIGS. 6 to 8, each single contact pin 20 includes a press-in portion 20a formed in a linear shape, a lower contact portion 20b formed by a width of a lower end portion of the press-in portion 20a being narrowed, a spring portion 20c provided so as to extend above the lower contact portion 20b, the spring portion 20c being curved in a shallow circular arc shape, a linear portion 20d extending upward from an upper end of the spring portion 20c, and an upper contact portion 20e positioned at an uppermost portion of the contact pin 20, the upper contact portion 20e being brought into contact with a solder ball 12b of the IC package 12.

In a portion that is immediately above the press-in portion 20a, a slightly wide stopper piece 20f having a shallow U-shape in a horizontal transverse section is formed. The press-in portion 20a is pressed into a press-in hole 17a (see FIGS. 3 and 4) of the base member 17 from above. Then, as illustrated in FIG. 3, the lower contact portion 20b projects to the lower side relative to a bottom surface of the base member 17, and the lower contact portion 20b is inserted into a through-hole (not illustrated) of a contact point provided in the wiring substrate 10, soldered to the wiring substrate 10 from the lower side of the wiring substrate 10 and thereby electrically connected to the contact point of the wiring substrate 10.

The spring portion 20c is a section close to an upper portion of the contact pin 20, the section being curved so as to provide a predetermined elastic force, and upon application of a pressing force to the contact pin 20 in an axial direction, elastically deforms so that a radius of the curve becomes smaller, thereby shortening an entire length of the contact pin 20 as well as generating a reactive force to extend the contact pin 20 upward. In the present embodiment, a multitude of the contact pins 20 are pressed in the base member 17 in such a manner that the spring portions 20c all face in a same direction. In Embodiment 1, the spring portion 20c has a curved shape, but may have another shape.

Figure 9A:
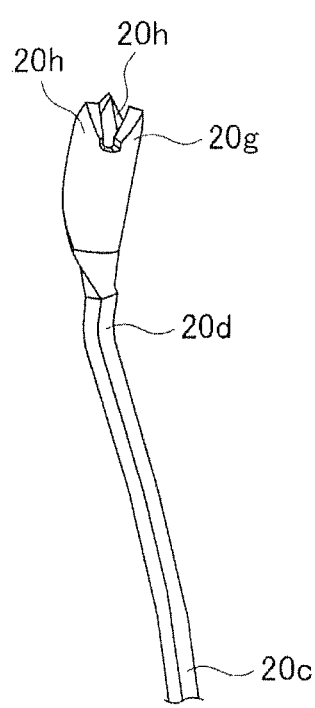
In FIG. 9A is a perspective view of an enlargement of an upper contact portion of a contact pin according to Embodiment 1.

The upper contact portion 20e is obtained by, for example, forming an upper end portion of the linear portion 20d into a T-shape and rolling up a transverse band part of the T-shape into a coronal shape (substantially cylindrical shape). At an upper edge portion of the cylindrical shape, as illustrated in FIG. 9A with enlargement, one first contact protrusion 20g and a plurality of (here, two) second contact protrusions 20h are arranged and formed in a substantially circular pattern. In Embodiment 1, the first and second contact protrusions 20g and 20h are arranged at intervals equal to one another.

Here, the first contact protrusion 20g is formed on an extension of the linear portion 20d. Thus, the first contact protrusion 20g can effectively transmit a force exerted from the solder ball 12b to the spring portion 20c via the linear portion 20d, and therefore, a reactive force generated as a result of the force transmission can bring the first contact protrusion 20g into very strong pressure contact with the solder ball 12b of the IC package 12. As a result of the pressure of contact between the first contact protrusion 20g and the solder ball 12b being made to be sufficiently high, electric resistance between the first contact protrusion 20g and the solder ball 12b can be stabilized (an electric resistance value can be prevented from greatly varying each time, e.g., a burn-in test is conducted). A shape of a distal end of the first contact protrusion 20g can arbitrarily be determined, but is desirably a sharp shape so that the distal end can be dug into the solder ball 12b of the IC package 12.

On the other hand, the second contact protrusions 20h are arranged at respective positions off the extension of the linear portion 20d. Thus, the second contact protrusions 20h are brought into pressure contact with the solder ball 12b of the IC package 12 by the reactive force generated as a result of elastic deformation of the spring portion 20c, weakly relative to the first contact protrusion 20g. As described above, the solder ball 12b is supported by the plurality of second contact protrusions 20h, which can make it difficult for the first contact protrusion 20g to come off from the solder ball 12b. Here, the positions at which the second contact protrusions 20h are arranged are desirably positions that are offset in a direction opposite to a direction of bulging of the curve of the spring portion 20c with reference to the extension of the linear portion 20d. Consequently, where a reactive force is applied to the linear portion 20d in a rotational direction as a result of elastic deformation of the spring portion 20c, the second contact protrusions 20h are brought into pressure contact with the solder ball 12b, enabling the solder ball 12b to be stably held.

Figure 9B:
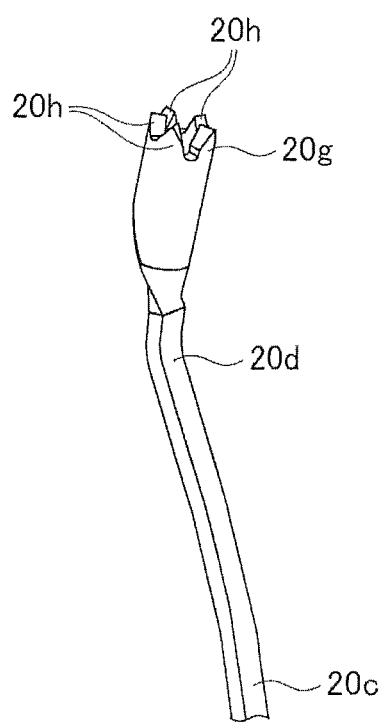
FIG. 9B is a perspective view illustrating an enlargement of an upper contact portion of a contact pin according to another embodiment.

In Embodiment 1, two second contact protrusions 20h are provided, but three or more second contact protrusions 20h may be provided. FIG. 9B illustrates an example in which four second contact protrusions 20h are provided.

Also, the first and second contact protrusions 20g and 20h are arranged at intervals equal to one another, but the intervals do not necessarily need to be equal to one another as long as the first and second contact protrusions 20g and 20h can stably support the solder ball 12b of the IC package 12.

The shape of the upper contact portion 20e may be a shape other than a coronal shape, but the first and second contact protrusions 20g and 20h are desirably formed so as to be in abutment with respective positions in the solder ball 12b of the IC package 12, the positions being off a distal end (center portion) of the solder ball 12b. Each upper contact portion 20e is inserted into the corresponding through-hole 22a (see FIG. 5) of the floating plate 22.

Next, a method of using the IC socket 11 will be described.

The IC socket 11 is disposed on the wiring substrate 10 in advance, and the lower contact portion 20b of each contact pin 20 is inserted into the wiring substrate 10. Then, the lower contact portions 20b are soldered to an electrode portion formed in the wiring substrate 10.

In order for the IC socket 11 to receive the IC package 12, first, the operation member 16 is lowered to the lowermost position against a biasing force of the non-illustrated coil springs to open the opening/closing bodies 14 and 15. In this state, the floating plate 22 is positioned at an uppermost position by the biasing force of the coil springs.

Subsequently, the IC package 12 is transported and placed on the IC socket 11 by a non-illustrated automatic machine, and then the peripheral edge portions of the IC package 12 are received in the receiving portion 22c of the floating plate 22. In the reception, the IC package 12 is guided to a predetermined position by the guide portions 22b of the floating plate 22.

Next, the operation member 16 is raised and positioned at the uppermost position to close the opening/closing bodies 14 and 15. Consequently, the IC package 12 is pressed downward by the pressing members 32, and as a result, the floating plate 22 is depressed downward against the biasing force of the coil springs.

Figure 10A:
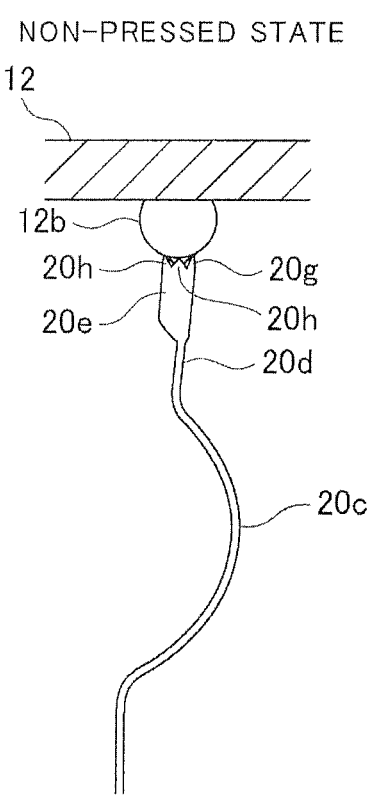
FIGS. 10A and 10B include cross-sectional views of the IC socket according to Embodiment 1.
Figure 10B:
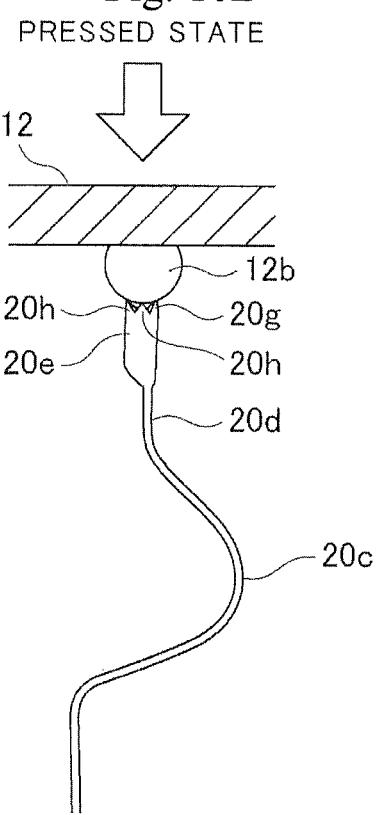

Consequently, the upper contact portions 20e of the contact pins 20 are brought into abutment with the respective solder balls 12b of the IC package 12 (see FIG. 10A). Then, upon the floating plate 22 being further depressed, each spring portion 20c elastically deforms, whereby a biasing force is generated. As a result, the upper contact portions 20e of the contact pins 20 are pressed by the respective solder balls 12b of the IC package 12 at a predetermined contact pressure (see FIG. 10B).

In this state, a current is made to flow in the IC package 12 to conduct, e.g., a burn-in test. Here, heat generated in the IC package 12 is released from the heatsink 33 that is in contact with the IC package 12.

As described above, in Embodiment 1, the first contact protrusion 20g is formed on the extension of each linear portion 20d and the distal end portion of the first contact protrusion 20g is brought into pressure contact with the corresponding solder ball 12b of the IC package 12 in a pressed state, and thus a force of the pressure contact can effectively be transmitted to the relevant spring portion 20c via the relevant linear portion 20d (see FIG. 10B), enabling provision of stable electric resistance. Also, the plurality of second contact protrusions 20h are arranged at the respective positions that are offset in the direction opposite to the direction of bulging of the curve of the relevant spring portion 20c with reference to the extension of the relevant linear portion 20d, and thus the second contact protrusions 20h support the corresponding solder ball 12b, which can make it difficult for the relevant first contact protrusion 20g to come off from the solder ball 12b. For reasons such as described above, Embodiment 1 enables reliability of, e.g., a burn-in test.

Here, regardless of a non-pressed state or a pressed state, it is desirable to set the upper contact portions 20e and the linear portions 20d so as not to interfere with the respective through-holes 22a of the floating plate 22.

Furthermore, the distal end portions of the first contact protrusions 20g are dug into the respective solder balls 12b of the IC package 12, enabling enhancement of conduction between the solder balls 12b and the upper contact portions 20e of the contact pins 20.

In addition, the first and second contact protrusions 20g and 20h are arranged in a substantially circular pattern at each upper contact portion 20e, and thus even if the solder balls 12b of the IC package 12 have a substantially spherical shape, stability of the contact can sufficiently be enhanced.

REFERENCE SIGNS LIST 10 wiring substrate (first electrical component)
11 IC socket (electrical component socket)
12 IC package (second electrical component)
12b solder ball (terminal of second electrical component)
13 socket body
14, 15 opening/closing body
16 operation member
17 base member
18 outer frame
20 contact pin
20a press-in portion
20b lower contact portion
20c spring portion
20d linear portion
20e upper contact portion
20f stopper piece
20g first contact protrusion
20h second contact protrusion
22 floating plate
33 heatsink

The invention claimed is:

1. A contact pin to electrically connect a first electrical component and a second electrical component, the contact pin comprising:
    a lower contact portion to be electrically connected to a contact point of the first electrical component;
    a spring portion that is provided so as to extend above the lower contact portion, and in a pressed state, elastically deforms;
    a linear portion provided so as to extend upward from an upper end of the spring portion; and
    an upper contact portion that is formed on an upper end side of the linear portion, and in the pressed state, is brought into pressure contact with a terminal of the second electrical component by an elastic force of the spring portion,
    wherein the upper contact portion includes,
    a single first contact protrusion arranged on an extension of the linear portion such that, in the pressed state, a contact pressure of a distal end portion of the first contact protrusion with the terminal of the second electrical component is at a first level, and
    a plurality of second contact protrusions arranged at respective positions off the extension of the linear portion such that, in the pressed state, a contact pressure of a distal end portion of each of the plurality of second contact protrusions with the terminal of the second electrical component is at a second level lower than the first level.

2. The contact pin according to claim 1, wherein at the upper contact portion, the first contact protrusion and the plurality of second contact protrusions are arranged in a substantially circular pattern.

3. The contact pin according to claim 1, wherein the spring portion has a curved shape, and the second contact protrusions are arranged so as to be offset in a direction opposite to a direction of bulging of a curve of the spring portion with reference to the extension of the linear portion.

4. The contact pin according to claim 1, wherein the first contact protrusion is formed in such a manner that the distal end portion thereof is dug into the terminal of the second electrical component.

5. An electrical component socket comprising:
    a socket body that is installed on a first electrical component, and includes a receiving portion to receive a second electrical component; and
    a plurality of contact pins disposed in the socket body, in a state in which the second electrical component is pressed, the plurality of contact pins electrically connecting the second electrical component to the first electrical component, wherein
    each of the contact pins includes
    a lower contact portion to be electrically connected to a contact point of the first electrical component, a spring portion that is provided so as to extend above the lower contact portion, and in the pressed state, elastically deforms, a linear portion provided so as to extend upward from an upper end of the spring portion, and an upper contact portion that is formed on an upper end side of the linear portion, and in the pressed state, is brought into pressure contact with a terminal of the second electrical component by an elastic force of the spring portion, and the upper contact portion includes a single first contact protrusion arranged on an extension of the linear portion such that, in the pressed state, a contact pressure of a distal end portion of the first contact protrusion with the terminal of the second electrical component is at a first level, and a plurality of second contact protrusions arranged at respective positions off the extension of the linear portion such that, in the pressed state, a contact pressure of a distal end portion of each of the plurality of second contact protrusions with the terminal of the second electrical component is at a second level lower than the first level.

6. A contact portion of a contact pin that electrically connects a first electrical component and a second electrical component, the contact portion being formed on one end of the contact pin and being brought into pressure contact with a terminal of one of the first electrical component and the second electrical component, the contact portion comprising:

a single first contact protrusion arranged on an extension of a linear portion of the contact pin such that, when the contact portion is brought into pressure contact with the terminal, a contact pressure of a distal end portion of the first contact protrusion with the terminal is at a first level, and a plurality of second contact protrusions arranged at respective positions off the extension of the linear portion such that, when the contact portion is brought into pressure contact with the terminal, a contact pressure of a distal end portion of each of the plurality of second contact protrusions with the terminal is at a second level lower than the first level.

* * * * *